(12) United States Patent
Weber et al.

(10) Patent No.: US 8,628,613 B2
(45) Date of Patent: Jan. 14, 2014

(54) METHOD FOR PRODUCING SEMICONDUCTOR WAFERS COMPOSED OF SILICON WITH REDUCED PINHOLES

(75) Inventors: Martin Weber, Kastl (DE); Werner Schachinger, Simbach (DE); Piotr Filar, Burghausen (DE)

(73) Assignee: Siltronic AG, Munich (DE)

( * ) Notice: Subject to any disclaimer, the term of this patent is extended or adjusted under 35 U.S.C. 154(b) by 247 days.

(21) Appl. No.: 13/089,352

(22) Filed: Apr. 19, 2011

(65) Prior Publication Data

US 2011/0304081 A1  Dec. 15, 2011

(30) Foreign Application Priority Data

Jun. 9, 2010  (DE) .......................... 10 2010 023 101

(51) Int. Cl.
*C30B 15/14* (2006.01)

(52) U.S. Cl.
USPC .................. 117/30; 117/11; 117/13; 117/14; 117/15; 117/19; 117/20; 117/31; 117/32; 117/73; 117/74

(58) Field of Classification Search
USPC ........... 117/11, 13–15, 19–20, 30, 32, 73–74, 117/931–932, 936
See application file for complete search history.

(56) References Cited

U.S. PATENT DOCUMENTS

| 6,458,202 | B1* | 10/2002 | Kojima et al. .................. 117/13 |
| 7,559,988 | B2 | 7/2009 | Cho |
| 8,172,941 | B2 | 5/2012 | Weber et al. |
| 2004/0192015 | A1* | 9/2004 | Ammon et al. ............... 438/502 |
| 2008/0011222 | A1* | 1/2008 | Shimomura et al. ............ 117/13 |
| 2008/0153261 | A1* | 6/2008 | Weber et al. .................. 438/460 |
| 2009/0249996 | A1 | 10/2009 | Watanabe |

FOREIGN PATENT DOCUMENTS

| DE | 10 2007 023 040 A1 | 11/2008 |
| JP | 2007031260 A | 2/2007 |
| JP | 2008156225 A | 7/2008 |
| JP | 2009-249240 A | 10/2009 |
| JP | 2009249245 A | 10/2009 |
| JP | 2010-030816 A | 2/2010 |

* cited by examiner

*Primary Examiner* — Michael Kornakov
*Assistant Examiner* — Kenneth A Bratland, Jr.
(74) *Attorney, Agent, or Firm* — Brooks Kushman P.C.

(57) ABSTRACT

Silicon semiconductor wafers are produced by pulling a single crystal at a seed crystal from a melt heated in a crucible; supplying heat to the center of the crucible bottom with a heating power which, in the course of the growth of a cylindrical section of the single crystal, is increased at least once to not less than 2 kW and is then decreased again; and slicing semiconductor wafers from the pulled single crystal.

13 Claims, 3 Drawing Sheets

METHOD FOR PRODUCING SEMICONDUCTOR WAFERS COMPOSED OF SILICON WITH REDUCED PINHOLES

CROSS-REFERENCE TO RELATED APPLICATIONS

This application claims priority to German Patent Application No. DE 102010023101.0 filed Jun. 9, 2010 which is herein incorporated by reference.

BACKGROUND OF THE INVENTION

1. Field of the Invention

The invention relates to a method for producing semiconductor wafers composed of silicon, comprising pulling a single crystal at a seed crystal from a melt heated in a crucible, supplying heat to the center of the crucible bottom, and slicing the semiconductor wafers from the pulled single crystal.

2. Background Art

The crucible used for Czochralski silicon single crystal growth usually consists of a material containing silicon dioxide, such as quartz. It is generally filled with chunks and/or with granules composed of polycrystalline silicon, the latter being melted with the aid of a side heater arranged around the crucible. After a phase of thermal stabilization of the melt, a monocrystalline seed crystal is dipped into the melt and raised. In this case, silicon crystallizes at that end of the seed crystal which has been wetted by the melt. The crystallization rate is substantially influenced by the speed at which the seed crystal is raised (crystal lifting speed), and by the temperature at the interface where molten silicon crystallizes. Through suitable control of these parameters, firstly a section referred to as a thin neck is pulled, in order to eliminate dislocations, followed by a conical section of the single crystal and, finally, a cylindrical section of the single crystal, from which the semiconductor wafers are subsequently sliced.

Liberated gaseous inclusions in the crucible material, in the gas that surrounds the chunks and/or the granules, as silicon oxide that arises in the melt, and as gas that diffuses into the melt are regarded as possible causes of the formation of voids referred to as pinhole defects in the single crystal. These arise if small gas bubbles pass to the interface between the growing single crystal and the melt and if the single crystal crystallizes around them. If the separating planes intersect the pinhole defects during the process of slicing the semiconductor wafers, the resulting semiconductor wafers have circular depressions or holes having a diameter which can typically be from a few micrometers up to a few millimeters. Semiconductor wafers in which such pinhole defects are present are unusable as substrate wafers for producing electronic components.

Therefore, a series of proposals as to how the formation of such pinhole defects can be suppressed have already been published. Many of these proposals direct the focus onto improving the properties of the crucible material. However, the crucibles improved in this respect generally are more expensive or entail other disadvantages, for example because they liberate substances which are responsible for the formation of dislocations in the single crystal.

Other proposals concentrate on suppressing or eliminating small bubbles during the period of the melting of the chunks and/or granules. Thus, by way of example, US 2008/0011222 A1 recommends concentrating the heating power of the side heater firstly onto the side surface of the crucible and subsequently onto the base surface of the crucible. What is disadvantageous about such measures is that they no longer influence the formation of small bubbles and the movement thereof to the interface as soon as the growth of the single crystal has begun.

SUMMARY OF THE INVENTION

It is an object of the present invention to propose a method which comprises at least one measure which counteracts the formation of pinhole defects in the single crystal and which is effective during the process of pulling the single crystal. These and other objects are achieved by means of a method for producing semiconductor wafers composed of silicon, comprising pulling a single crystal from a seed crystal in a melt heated in a crucible; supplying heat to the center of the crucible bottom with a heating power which, in the course of a cylindrical section of the single crystal being pulled, is increased at least once to not less than 2 kW and is then decreased again; and slicing the semiconductor wafers from the pulled single crystal.

DETAILED DESCRIPTION OF THE PREFERRED EMBODIMENT(S)

Figure 1:
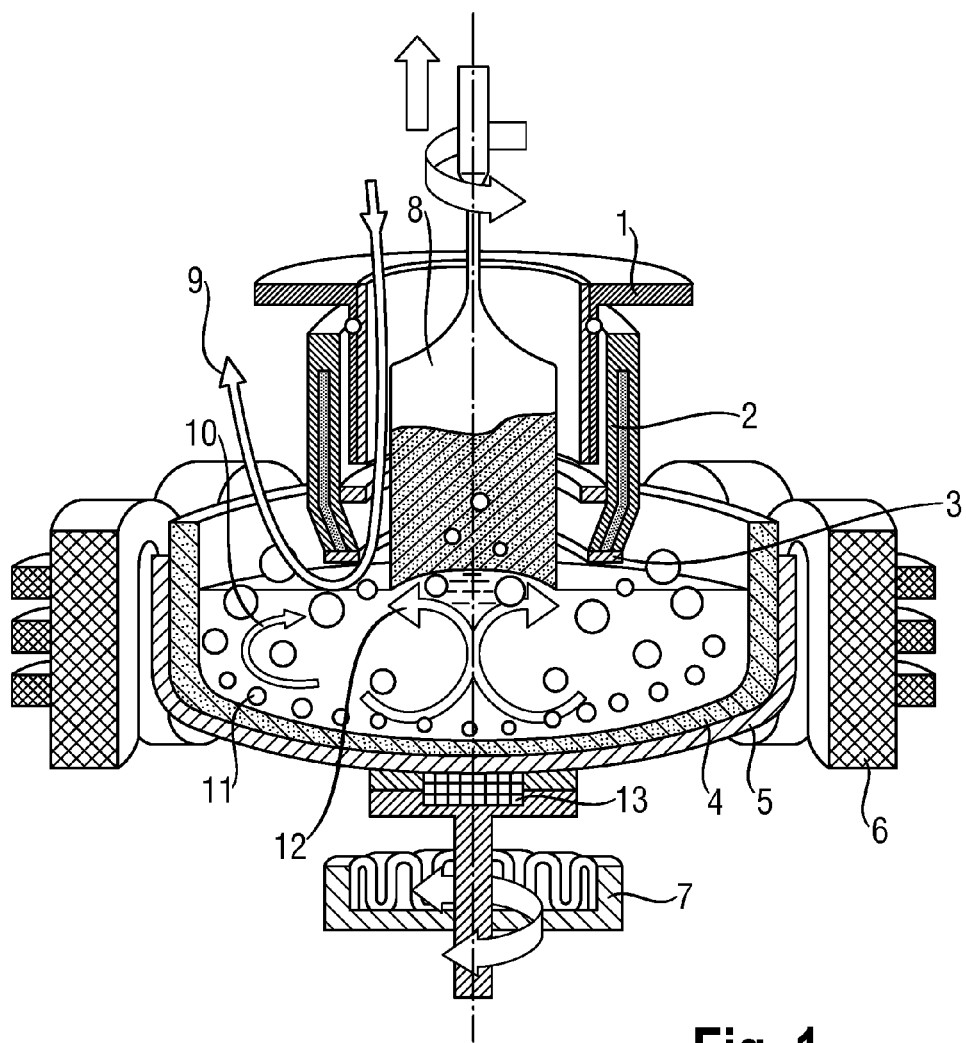
FIG. 1 illustrates one arrangement that is particularly suitable for carrying out the method.

The inventors have surprisingly and unexpectedly discovered that the frequency of pinhole defects in semiconductor wafers composed of silicon decreases significantly if the temperature field in the region of the crucible bottom, during the process of pulling the cylindrical section of the single crystal, is changed at least once in such a way that the highest temperature in the crucible bottom migrates from a position at the edge of the crucible bottom as far as the center of the crucible bottom. It is supposed that, in the course of this, small gas bubbles that adhere to the inner wall of the crucible bottom are detached by a convectively driven melt flow that transports them as far as the free surface of the melt, this free surface not being covered by the crucible and the growing single crystal. In this way, the small gas bubbles can leave the melt without passing to the interface between the growing single crystal and the melt.

The change in the temperature field is preferably effected with the aid of a heating device (crucible bottom heater) that is adjacent to the crucible bottom and can be lifted and lowered with the crucible. For this purpose, the heating power of the crucible bottom heater is increased at least once to not less than 2 kW, preferably to 2-5 kW, and then decreased again. The heating power is preferably increased at least once from 0 kW to 2-5 kW and then decreased to 0 kW again. An increase in the heating power to less than 2 kW has only a small influence on avoiding pinhole defects, and an increase to more than 5 kW subjects the crucible to thermal stress to an inappropriate extent and can be a trigger for the formation of dislocations in the single crystal.

The heating power of the crucible bottom heater is preferably increased in a manner following a ramp within a time period which is not shorter than 90 min and is not longer than 900 min. In this case, the rate at which the single crystal is pulled from the melt is preferably 0.3 to 0.8 mm/min, more preferably 0.45-0.65 mm/min. The ramp comprises a portion with a preferably linearly increasing heating power of the crucible bottom heater, if appropriate a portion with constant heating power of the crucible bottom heater, and a portion with decreasing heating power of the crucible bottom heater. The portion with constant heating power preferably extends over a time period of 0-90 min. A heating power profile comprising 1-10 of such ramps is particularly preferred.

Furthermore, it is preferred for the transport of small gas bubbles to the free surface of the melt to be supported by a series of further measures. The preferred measures include exposing the melt to the influence of a horizontal magnetic field or a CUSP magnetic field with a magnetic flux density of not less than 50 mT at the edge of the crucible bottom. The edge of the crucible bottom is the location of the transition from the cylindrical side wall of the crucible to the crucible bottom. It is particularly preferred to expose the melt to the influence of a CUSP magnetic field whose neutral surface intersects the central longitudinal axis of the single crystal at a distance from the plane of the free surface of the melt of not less than 90 mm.

The preferred measures also include rotating the crucible at a speed of not more than 3 revolutions per minute, preferably at 1-2 revolutions per minute, and rotating the single crystal at a speed of not less than 6 revolutions per minute, preferably at 6-12 revolutions per minute. The crucible and the single crystal are rotated in the same direction or in opposite directions. Rotation in opposite directions is preferred. The rotational speeds are accordingly specified as absolute values.

Finally, the preferred measures also include conducting inert gas, for example argon, to the free surface of the melt in order that gas escaping from the melt is removed from the region of the melt and of the single crystal. The volumetric flow rate of the inert gas is preferably 600-12,000 l/h, more preferably 1500-3000 l/h, preferably at a pressure of 11 to 80 mbar (1100-8000 Pa).

The arrangement in accordance with FIG. 1 comprises a crucible 4, which is mounted into a supporting crucible 5 and which contains a melt composed of silicon. The crucible preferably consists of quartz and has a diameter that preferably corresponds to 2 to 4 times the diameter of the single crystal 8. The crucible 4 and the supporting crucible 5 rest on a crucible shaft that can be lifted and lowered and are surrounded by a side heater 6 embodied as a resistance heater. By means of the side heater, heat is transferred to the melt substantially from the side. A magnetic device is situated on the outside adjoining the side heater 6, by means of which the melt is exposed to the influence of a horizontal magnetic field or a CUSP magnetic field. The illustration shows coils suitable for impressing a CUSP magnetic field on the melt.

A further stationary bottom heater 7 embodied as a resistance heater is arranged below the supporting crucible around the crucible shaft. By means of the stationary bottom heater, heat is transferred to the melt substantially from below.

The single crystal 8 is pulled from the melt at a seed crystal, and is shielded against thermal radiation from the outside by a heat shield 2 and cooled by a cooler 1, through which coolant flows. The nominal diameter of the single crystal composed of silicon is preferably 300 mm or 450 mm. The distance between the free surface of the melt and the lower boundary 3 of the heat shield 2 is preferably 20-30 mm. The distance between the free surface of the melt and the lower boundary of the cooler 1 is preferably 160-200 mm.

A crucible bottom heater 13 embodied as a resistance heater is integrated in the head of the crucible shaft, the heating power of the crucible bottom heater being altered according to the invention in order that small gas bubbles 11 that adhere to the inner wall of the crucible 4 are detached by correspondingly directed melt flows 10 and 12 and are transported to the free surface of the melt. From there, the small gas bubbles together with silicon oxide escaping from the melt are taken up by an inert gas flow 9 directed to the free surface of the melt and are removed from the region of the melt and the region of the growing single crystal.

Figure 2:
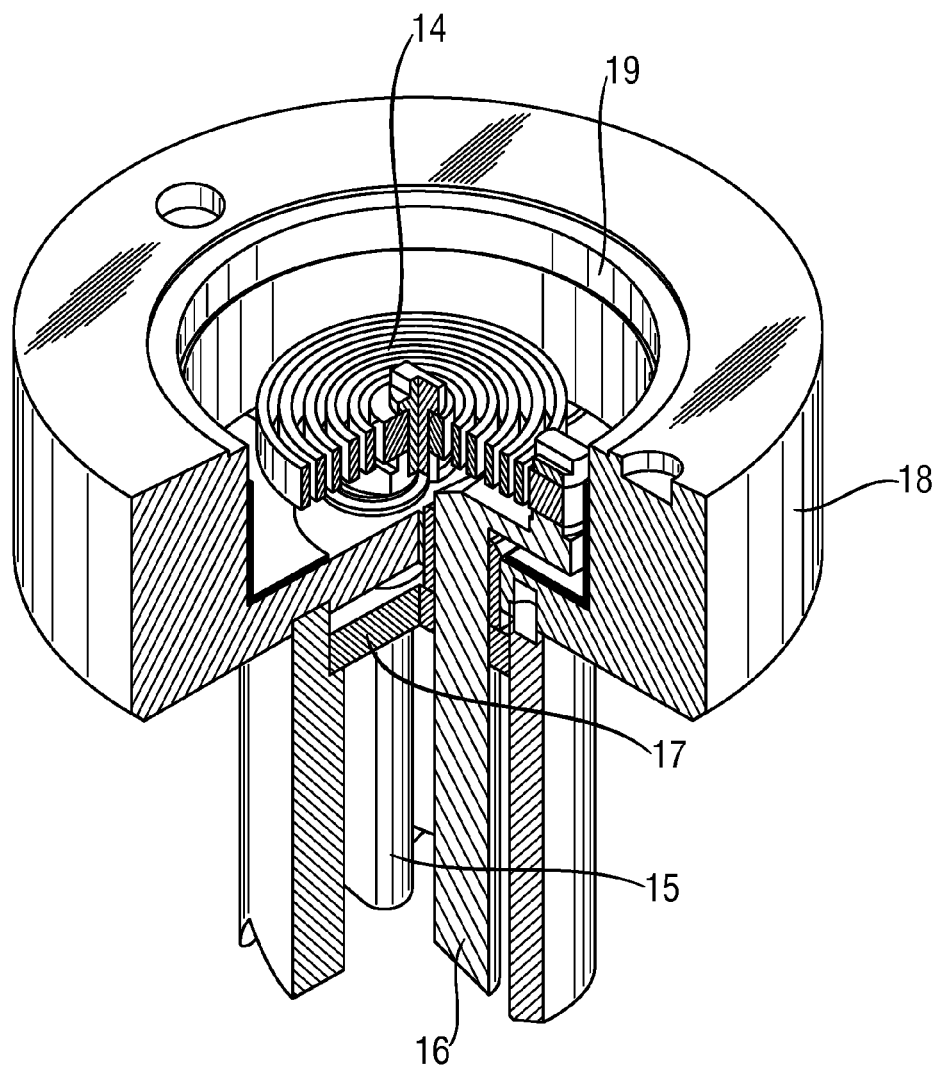
FIG. 2 illustrates one configuration of a crucible bottom heater that is particularly suitable for carrying out the method.

Details of the configuration of a crucible bottom heater that is particularly suitable for carrying out the method are illustrated in FIG. 2. The crucible bottom heater comprises a heating spiral 14 composed of graphite, which is supplied with electric AC current via inner and outer current feeds 15 and 16 led through the crucible shaft. The heating spiral is thermally insulated at the bottom by a plate 17 and laterally by a ring 18 composed of carbon fiber reinforced carbon (CFC). The inner wall of the ring is lined with a metallic reflector 19. In addition to the features illustrated, the heating spiral can be embodied in meandering fashion or be magnetically shielded in order to protect it against interactions with the magnetic field impressed on the melt.

Figure 3:
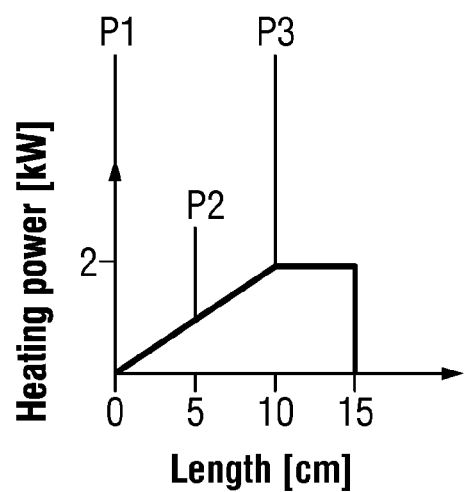
FIG. 3 illustrates the temporal profile of the heating power of the crucible bottom heater in accordance with one preferred embodiment.

FIG. 3 shows how the heating power of the crucible bottom heater heater 13 is changed over the course of time in accordance with one preferred embodiment of the invention. The heating power is changed in a ramp manner comprising a linear portion and a constant portion. The time axis is specified in the unit of length L of grown single crystal. Given a typical crystal lifting speed for single crystals having a nominal diameter of 300 mm of 0.55 mm/min, the length L=5 cm corresponds to a time period of approximately 90 min. The portion with linearly rising heating power of the crucible bottom heater extends over a time period that is somewhat shorter than the time required to pull a length of 100 mm of the single crystal. The portion with constant heating power of the crucible bottom heater extends over a time period that is somewhat longer than the time required to pull a length of 50 mm of the single crystal.

Figure 4:
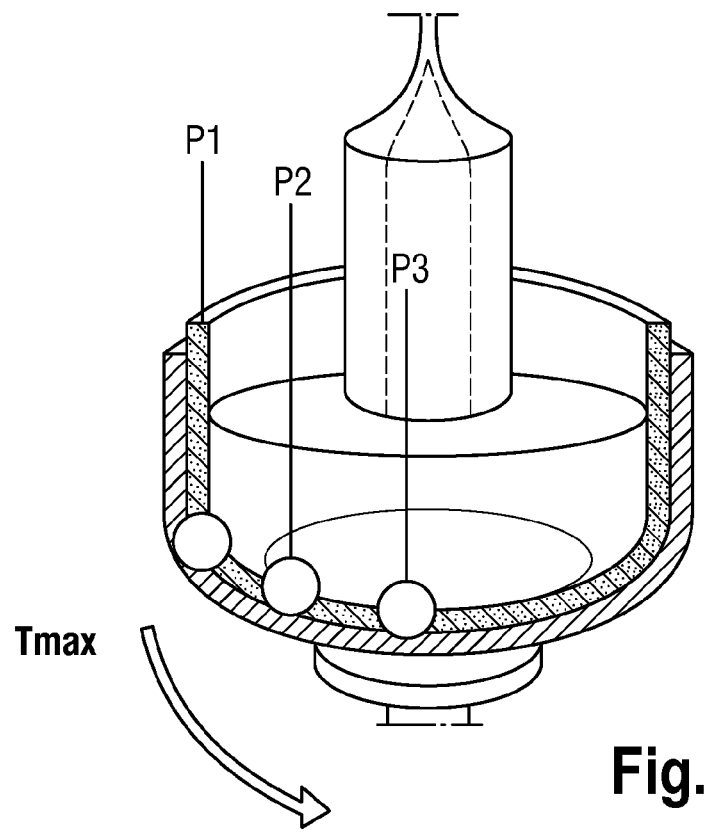
FIG. 4 illustrates the spatial movement of the highest temperature on the inner wall of the crucible in a manner dependent on the temporal alteration of the heating power of the crucible bottom heater.

The change in the heating power of the crucible bottom heater in a manner that follows the ramp has the effect illustrated in FIG. 4 that the highest temperature (Tmax) in the crucible bottom migrates from a position P1 at the edge of the crucible bottom via an intervening position P2 as far as the center P3 of the crucible bottom. In the course of this, small gas bubbles that adhere to the inner wall of the crucible bottom are detached by a convectively driven melt flow and transported to the free surface of the melt, e.g. the free surface not being covered by the crucible and the growing single crystal.

EXAMPLE

A series of single crystals composed of silicon having a nominal diameter of 300 mm were pulled from a crucible having a diameter of 28 inches (711.2 mm) by means of the arrangement shown in FIG. 1, in accordance with the method according to the invention. The average crystal lifting speed was 0.55 mm/min during the process of pulling the cylindrical section of a single crystal. At the beginning of the process of pulling the cylindrical section of a single crystal, the heating power of the crucible bottom heater was altered once in accordance with the ramp illustrated in FIG. 3. For comparison purposes, further single crystals were pulled under the same conditions, but without this alteration of the heating power of the crucible bottom heater. A statistical evaluation of the frequency of the occurrence of pinhole defects revealed a failure frequency approximately 30 times higher, on average, on account of such defects in the case of the semiconductor wafers that had been sliced from the single crystals pulled for comparison purposes.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A method for producing silicon semiconductor wafers, comprising pulling a single crystal at a seed crystal from a melt having a free surface heated in a crucible by means of a side heater embodied as a resistance heater;

during the pulling of a cylindrical section of the single crystal, supplying heat to the center of the crucible bottom by means of a heating device adjacent to the crucible bottom which can be lifted and lowered with the crucible, wherein the heat is supplied with a heating power which is increased at least once to not less than 2 kW and in a manner following a ramp within a time period which is ≥90 min and <900 min such that the highest temperature in the crucible bottom migrates from a position at the edge of the crucible bottom as far as the center of the crucible bottom, and the heating power is then decreased again; and slicing silicon semiconductor wafers from the pulled single crystal.

2. The method of claim 1, further comprising exposing the melt to the influence of a horizontal magnetic field or a CUSP magnetic field with a magnetic flux density of not less than 50 mT at an edge of the crucible bottom.

3. The method of claim 1, further comprising exposing the melt to the influence of a CUSP magnetic field whose neutral surface intersects a central longitudinal axis of the single crystal at a distance from the plane of the free surface of the melt of not less than 90 mm.

4. The method of claim 2, further comprising exposing the melt to the influence of a CUSP magnetic field whose neutral surface intersects a central longitudinal axis of the single crystal at a distance from the plane of the free surface of the melt of not less than 90 mm.

5. The method of claim 1, further comprising rotating the crucible at a speed of not more than 2 revolutions per minute and rotating the single crystal at a speed of not less than 6 revolutions per minute.

6. The method of claim 2, further comprising rotating the crucible at a speed of not more than 2 revolutions per minute and rotating the single crystal at a speed of not less than 6 revolutions per minute.

7. The method of claim 3, further comprising rotating the crucible at a speed of not more than 2 revolutions per minute and rotating the single crystal at a speed of not less than 6 revolutions per minute.

8. The method of claim 1, further comprising conducting inert gas to the free surface of the melt at a volumetric flow rate of 600-12,000 l/h at a pressure of 1100-8000Pa.

9. The method of claim 1, wherein the ramp comprises a portion with a substantially linearly increasing heating power and a portion with a decreasing heating power.

10. The method of claim 1, wherein the ramp comprises a portion with a substantially linearly increasing heating power, a portion with a substantially constant heating power, and a portion with a decreasing heating power.

11. The method of claim 1, wherein the heating power is increased and decreased a plurality of times during growth of the cylindrical section of the single crystal.

12. The method of claim 11, wherein the heating power is increased and decreased from 2 to 10 times during growth of the cylindrical section of the single crystal.

13. The method of claim 1, wherein the heating power is increased to from not less than 2 kW to 5 kW.

* * * * *